United States Patent
Tseng et al.

(10) Patent No.: US 8,365,401 B2
(45) Date of Patent: Feb. 5, 2013

(54) CIRCUIT BOARD AND MANUFACTURING METHOD THEREOF

(75) Inventors: Tzyy-Jang Tseng, Hsinchu (TW); Shu-Sheng Chiang, Taipei (TW); Tsung-Yuan Chen, Taoyuan County (TW)

(73) Assignee: Unimicron Technology Corp., Taoyuan (TW)

( * ) Notice: Subject to any disclaimer, the term of this patent is extended or adjusted under 35 U.S.C. 154(b) by 389 days.

(21) Appl. No.: 12/732,512

(22) Filed: Mar. 26, 2010

(65) Prior Publication Data

US 2011/0114373 A1 May 19, 2011

(30) Foreign Application Priority Data

Nov. 17, 2009 (TW) .................................. 98138996 A (51) Int. Cl.
*H05K 3/02* (2006.01)
*H05K 3/10* (2006.01)
(52) U.S. Cl. ......................................................... 29/846
(58) Field of Classification Search ............. 29/846–854
See application file for complete search history.

(56) References Cited

FOREIGN PATENT DOCUMENTS

| CN | 101351087 A | 1/2009 |
|---|---|---|
| TW | 200800447 | 1/2008 |

OTHER PUBLICATIONS

Chinese First Examination Report of China Application No. 200910262179.7, dated Jan. 5, 2012.

*Primary Examiner* — Jeremy Norris
(74) *Attorney, Agent, or Firm* — J.C. Patents (57) ABSTRACT

A circuit board includes a circuit substrate, a dielectric layer disposed on the circuit substrate and a patterned circuit structure. The dielectric layer covers a first surface and at least a first circuit of the circuit substrate. The dielectric layer has a second surface, at least a blind via, a second intaglio pattern and a third intaglio pattern connected to the blind via. The patterned circuit structure includes at least a second circuit disposed in the second intaglio pattern and third circuits disposed in the third intaglio pattern and the blind via. Each third circuit has a first conductive layer and a second conductive layer. The materials of the first conductive layer and the second circuit are the same. The line width of the second circuit is shorter than that of each third circuit. At least a third circuit is electrically connected to the first circuit of the circuit substrate.

10 Claims, 13 Drawing Sheets

FIG. 3E

CIRCUIT BOARD AND MANUFACTURING METHOD THEREOF

CROSS-REFERENCE TO RELATED APPLICATION

This application claims the priority benefit of Taiwan application serial no. 98138996, filed on Nov. 17, 2009. The entirety of the above-mentioned patent application is hereby incorporated by reference herein and made a part of this specification.

BACKGROUND OF THE INVENTION

1. Field of the Invention

The invention relates to a circuit board and a manufacturing method thereof. More particularly, the invention relates to a circuit board having circuits formed by two different conductive layers within the same circuit layer and a manufacturing method thereof.

2. Description of Related Art

Currently, the technology of a circuit board has evolved from a conventional non-embedded circuit board to an embedded circuit board. In particular, the conventional non-embedded circuit board is characterized in that circuits therein protrude from a surface of a dielectric layer. By contrast, circuits of the embedded circuit board are buried in the dielectric layer. Currently, a circuit structure of the circuit board is usually formed by performing a photolithography and etching process or a laser ablating process.

A process of forming build-up circuits of the embedded circuit board by the laser ablating process is taken as an example and includes the following. A dielectric layer is provided at first. Next, the surface of the dielectric layer is irradiated by a laser beam, so as to form an intaglio pattern and a blind via. Thereafter, an electroplating process is performed to form a conductive material layer filling the blind via and the intaglio pattern. Up to this point, a structure of the build-up circuits of the embedded circuit board has been completed in general.

However, a conventional conductive material layer has to have a certain thickness in order to fill up the blind via. In addition, when forming the conductive material layer by electroplating, the electroplating may not be performed evenly, such that the conductive material layer is not distributed evenly with an even thickness. Thus, when removing a portion of the conductive material layer outside of the blind via and the intaglio pattern, the thickness removed from the conductive material layer is hard to be controlled. Consequently, the embedded circuit layer can be thinned improperly in the removal. Moreover, a portion of the conductive material layer can be remained improperly to cause a short-circuit between circuits of the embedded circuit layer. Furthermore, the aforementioned issue becomes more obvious when the circuits of the embedded circuit layer are fine lines.

SUMMARY OF THE INVENTION

The invention is directed to a circuit board having a second circuit (that is, a fine line) formed by a single conductive layer and third circuits (that is, a conventional circuit) formed by two different conductive layers within the same circuit layer.

The invention is further directed to a method of manufacturing a circuit board. This method is capable of manufacturing the circuit board aforementioned and has superior manufacturing yield rate and reliability.

The invention is directed to a circuit board including a circuit substrate, a dielectric layer, and a patterned circuit structure. The circuit substrate has a first surface and at least one first circuit. The dielectric layer is disposed on the circuit substrate and covers the first surface and the first circuit. The dielectric layer has a second surface, at least a blind via extending from the second surface to the first circuit, a second intaglio pattern, and a third intaglio pattern. The third intaglio pattern is connected to the blind via. The patterned circuit structure includes at least one second circuit and a plurality of third circuits. The second circuit is disposed within the second intaglio pattern. The third circuits are disposed within the third intaglio pattern and the blind via. Each third circuit has a first conductive layer and a second conductive layer. The first conductive layer is disposed between the second conductive layer and the third intaglio pattern and between the second conductive layer and the blind via. The first conductive layer and the second circuit are substantially made of the same material. A line width of the second circuit is thinner than a line width of each third circuit. At least one of the third circuits is electrically connected to the first circuit of the circuit substrate.

According to an embodiment of the invention, the circuit substrate further includes a first intaglio pattern disposed on the first surface, and the first circuit is disposed within the first intaglio pattern.

According to an embodiment of the invention, the first circuit is disposed on the first surface of the circuit substrate.

According to an embodiment of the invention, the dielectric layer is made of a polymer compound.

According to an embodiment of the invention, a material of the polymer compound includes epoxy, modified epoxy, polyester, acrylate, fluoro-polymer, polyphenylene oxide, polyimide, phenolicresin, polysulfone, silicone polymer, bis-maleimide triazine modified epoxy(BT resin), ajinomoto build-up film epoxy(ABF), cyanate ester, polyethylene, polycarbonate, acrylonitrile-butadiene-styrene copolymer, polyethylene terephthalate, polybutylene terephthalate, liquid crystal polymers, polyamide 6, nylon, polyoxymethylene, polyphenylene sulfide, cyclic olefin copolymer, or a combination thereof.

According to an embodiment of the invention, the second circuit is an electroless copper plating layer.

According to an embodiment of the invention, the second circuit is an electroless copper layer.

According to an embodiment of the invention, the first conductive layer is an electroless copper plating layer.

According to an embodiment of the invention, the first conductive layer is an electroless copper layer.

According to an embodiment of the invention, the second conductive layer is an electroplated copper layer.

The invention is further directed to a method of manufacturing a circuit board. Firstly, a circuit substrate is provided. The circuit substrate has a first surface and at least one first circuit. A dielectric layer is then formed on the circuit substrate. The dielectric layer covers the first surface and the first circuit. The dielectric layer has a second surface, and a metal layer and a barrier layer covering the metal layer are formed on the second surface. The barrier layer is irradiated by a laser beam to form an intaglio pattern extending from the barrier layer to the second surface of the dielectric layer and at least one blind via extending to the first circuit of the circuit substrate. A first conductive layer is formed within the intaglio pattern and the blind via. Then, a second conductive layer is formed on the first conductive layer. Finally, a portion of the second conductive layer, the barrier layer, the metal layer, and a portion of the first conductive layer are removed to form a patterned circuit structure and expose the second surface of the dielectric layer. The patterned circuit structure is disposed within the intaglio pattern and the blind via and electrically connected to the first circuit of the circuit substrate.

According to an embodiment of the invention, the circuit substrate further includes a first intaglio pattern disposed on the first surface, and the first circuit is disposed within the first intaglio pattern.

According to an embodiment of the invention, a method of forming the metal layer includes performing an electroless plating process.

According to an embodiment of the invention, the barrier layer is made of nickel, tin, chromium, zinc, or gold.

According to an embodiment of the invention, the intaglio pattern includes a second intaglio pattern and a third intaglio pattern. The third intaglio pattern is connected to the blind via. The patterned circuit structure includes at least one second circuit and a plurality of third circuits. The second circuit is disposed within the second intaglio pattern. The third circuits are disposed within the third intaglio pattern and the blind via. A line width of the second circuit is shorter than a line width of each third circuit. At least one of the third circuits is electrically connected to the first circuit of the circuit substrate.

According to an embodiment of the invention, before the second conductive layer is formed on the first conductive layer, the first conductive layer fills the second intaglio pattern to form the second circuit of the patterned circuit structure.

According to an embodiment of the invention, a method of forming the first conductive layer includes performing an electroless plating process.

According to an embodiment of the invention, a method of forming the second conductive layer includes performing an electroplating process.

According to an embodiment of the invention, the step of removing a portion of the second conductive layer, the barrier layer, the metal layer, and a portion of the first conductive layer includes the following. A first etching process is performed to remove a portion of the second conductive layer and a portion of the first conductive layer until the barrier layer is exposed. A second etching process is performed to remove the barrier layer until the metal layer is exposed. A third etching process is performed to remove the metal layer until the second surface of the dielectric layer is exposed.

According to an embodiment of the invention, before the second etching process is carried out, a polishing process is further performed to the barrier layer.

In light of the foregoing, in the invention, the metal layer and the barrier layer are first formed on the dielectric layer. Then, the intaglio pattern and the blind via are formed on the dielectric layer using the laser beam. Next, the first conductive layer and the second conductive layer are sequentially formed within the intaglio pattern and the blind via so as to form circuits having two different conductive layers within the same circuit layer. Moreover, in the etching process, the barrier layer is used as an etching stop layer for removing the first conductive layer and the second conductive layer outside of the intaglio pattern and the blind via. The metal layer is adopted as the etching stop layer of the barrier layer. Hence, the method of manufacturing the circuit board of the invention has superior manufacturing yield rate and reliability.

In order to make the aforementioned and other features and advantages of the invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
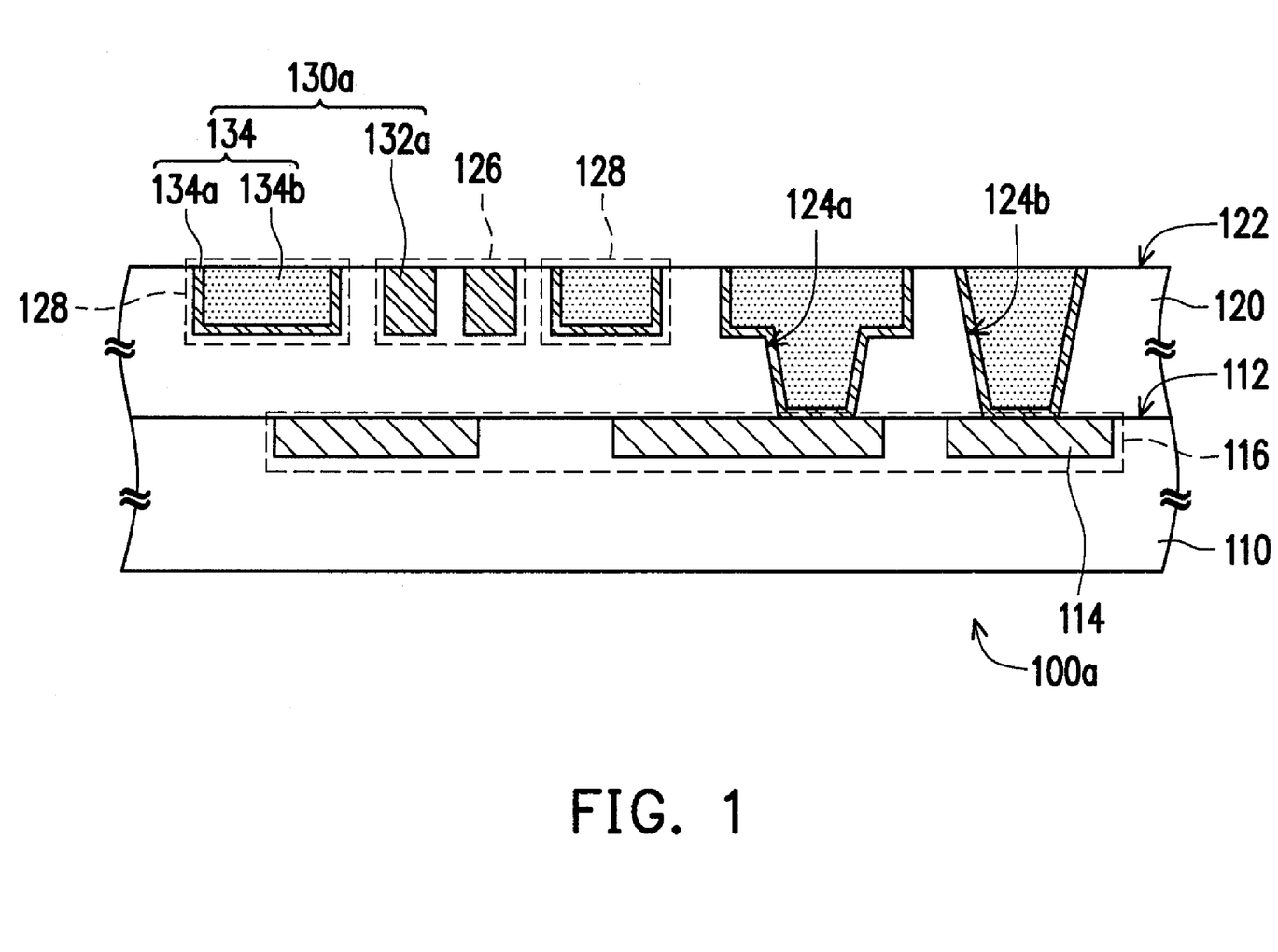
FIG. 1 is a schematic cross-sectional view of a circuit board according to an embodiment of the invention.

FIG. 1 is a schematic cross-sectional view of a circuit board according to an embodiment of the invention. Referring to FIG. 1, in the present embodiment, a circuit board 100a includes a circuit substrate 110, a dielectric layer 120, and a patterned circuit structure 130a. It should be noted that the circuit board 100a can merely have a single layer circuit layer or have multi-layer circuit layers. That is to say, the circuit board 100a can be a single layer circuit board, a double layer circuit board, or a multi-layer circuit board. In the present embodiment, the circuit board 100a depicted in FIG. 1 is a build-up circuit board.

In details, the circuit substrate 110 has a first surface 112, at least one first circuit 114, (only three first circuits 114 are shown in FIG. 1) and a first intaglio pattern 116. The first circuit 114 is disposed within the first intaglio pattern 116 of the circuit substrate 110. Moreover, the first circuit 114 substantially flats with the first surface 112 of the circuit substrate 110. In other words, the first circuit 114 is basically an embedded circuit. It should be noted that in the embodiment illustrated in FIG. 1, the circuit substrate 110 has the first intaglio pattern 116 and the first circuit 114 is disposed within the first intaglio pattern 116 of the circuit substrate 110. However, in other embodiments not illustrated herein, the circuit substrate 110 may not include the first intaglio pattern 116. Additionally, the first circuit 114 can be directly disposed on the first surface 112 of the circuit substrate 110. That is, the first circuit 114 disposed on the first surface 112 is referred as a non-embedded circuit. Accordingly, the structure of the circuit substrate 110 depicted in FIG. 1 merely serves as an example and the invention is not limited thereto.

The dielectric layer 120 is disposed on the circuit substrate 110 and covers the first surface 112 and the first circuit 114. The dielectric layer 120 has a second surface 122, blind vias 124a, 124b extending from the second surface 122 to the first circuit 114, a second intaglio pattern 126, and a third intaglio pattern 128. The third intaglio pattern 128 is connected to the blind via 124a. In the present embodiment, the material of the dielectric layer 120 is a polymer compound. The polymer compound is, for example, epoxy, modified epoxy, polyester, acrylate, fluoro-polymer, polyphenylene oxide, polyimide, phenolicresin, polysulfone, silicone polymer, bismaleimide triazine modified epoxy(BT resin), ajinomoto build-up film epoxy(ABF resin), cyanate ester, polyethylene, polycarbonate, acrylonitrile-butadiene-styrene copolymer, polyethylene terephthalate, polybutylene terephthalate, liquid crystal polymers, polyamide 6, nylon, polyoxymethylene, polyphenylene sulfide, cyclic olefin copolymer, or a combination thereof.

The patterned circuit structure 130a includes at least one second circuit 132a (only two second circuits 132a are shown in FIG. 3) and a plurality of third circuits 134 (only four third circuits 134 are shown in FIG. 1). The second circuit 132a is disposed within the second intaglio pattern 126. The third circuits 134 are disposed within the third intaglio pattern 128 and the blind vias 124a, 124b. The third circuit 134 disposed within the blind via 124a is electrically connected to the first circuit 114 of the circuit substrate 110. Each third circuit 134 has a first conductive layer 134a and a second conductive layer 134b. The first conductive layer 134a is an electroless copper plating layer or an electroless copper layer, for example, and the second conductive layer 134b is an electroplated copper layer, for instance. The first conductive layer 134a is disposed between the second conductive layer 134b and the third intaglio pattern 128 and between the second conductive layer 134b and the blind vias 124a, 124b. The first conductive layer 134a and the second circuit 132a are substantially made of the same material. That is, the second circuit 132a is also an electroless copper plating layer or an electroless copper layer.

In details, the second circuit 132a is disposed within the second intaglio pattern 126 of the dielectric layer 120. Further, the second circuit 132a substantially flats with the second surface 122 of the dielectric layer 120. In other words, the second circuit 132a is basically an embedded circuit. The third circuits 134 are disposed within the third intaglio pattern 128 and the blind vias 124a, 124b of the dielectric layer 120. The third circuit 134 and the second surface 122 of the dielectric layer 120 are substantially flatted. In other words, each third circuit 134 is basically an embedded circuit. Moreover, the third circuits 134 disposed within the blind vias 124a, 124b are considered as a connected circuit. The third circuits 134 can be electrically connected to the first circuit 114 of the circuit substrate 110 through the third circuit 134 disposed within the blind via 124a. Obviously, in other embodiments, the third circuits 134 can also be electrically connected to the first circuit 114 without adopting the third circuit 134 disposed within the blind via 124a. Therefore, the connection among the first circuit 114, the third circuits 134, and the third circuit 134 disposed within the blind via 124a as shown in FIG. 1 is merely exemplary, and the invention is not limited thereto.

Particularly, in the present embodiment, a line width of the second circuit 132a is thinner than a line width of each third circuit 134. That is, relative to the second circuit 132a, the third circuits 134 are referred as conventional circuits. On the contrary, relative to the third circuits 134, the second circuit 132a is referred as a fine line. For example, in the present embodiment, the line width of the second circuit 132a, for example, is thinner than 15 μm, and the line width of each third circuit 134 is wider than the line width of the second circuit 132a. In other words, the line width of each third circuit 134 is wider than 15 μm.

In short, in the present embodiment, the patterned circuit structure 130a includes the second circuit 132a having a single conductive layer (i.e. an electroless electroplated copper layer) and the third circuits 134 having a composite conductive layer (i.e. an electroless copper plating layer and an electroplated copper layer). The line width of the second circuit 132a is thinner than the line width of each third circuit 134. Hence, the circuit board 100a of the present embodiment includes the second circuit 132a having the single conductive layer (that is, the fine line) and the third circuits 134 having two different conductive layers (that is, the conventional circuit) within the same circuit layer.

Up to this point, only the structure of the circuit board 100a of the invention is described, while a method of manufacturing the circuit board 100a of the invention is not yet provided. Accordingly, the structure of the circuit board 100a in FIG. 1 is used as an example in cooperation with FIGS. 2A to 2H to illustrate a method of manufacturing the circuit board 100a of the invention in detail.

Figure 2A:
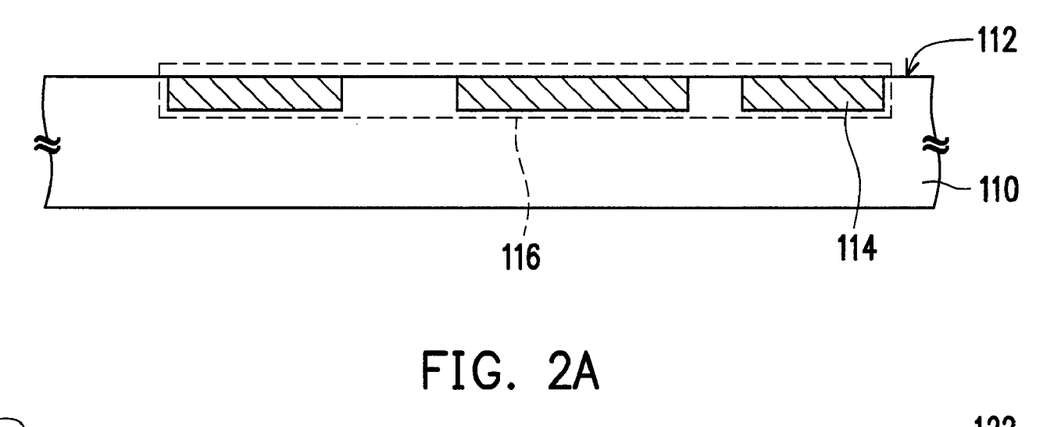
FIGS. 2A through 2H are schematic cross-sectional views illustrating a method of manufacturing a circuit board according to an embodiment of the invention.

FIGS. 2A through 2H are schematic cross-sectional views illustrating a method of manufacturing a circuit board according to an embodiment of the invention. Referring to FIG. 2A, in a method of manufacturing the circuit board 100a according to the present embodiment, a circuit substrate 110 is provided at first. The circuit substrate 110 has a first surface 112, at least one first circuit 114, (only three first circuits 114 are shown in FIG. 2A) and a first intaglio pattern 116. The first circuit 114 is disposed within the first intaglio pattern 116. Moreover, the first circuit 114 substantially flats with the first surface 112 of the circuit substrate 110. In other words, the first circuit 114 is basically an embedded circuit. The first intaglio pattern 116 can be formed by adopting laser ablation, plasma etching, or mechanical processing, and the invention is not limited herein.

It should be illustrated that in other embodiments, the circuit substrate 110 may not include the first intaglio pattern 116. Additionally, the first circuit 114 can be directly disposed on the first surface 112 of the circuit substrate 110. The first circuit 114 disposed on the first surface 112 is referred as a non-embedded circuit. Accordingly, the structure of the circuit substrate 110 depicted in FIG. 2A merely serves as an example and the invention is not limited thereto.

Figure 2B:
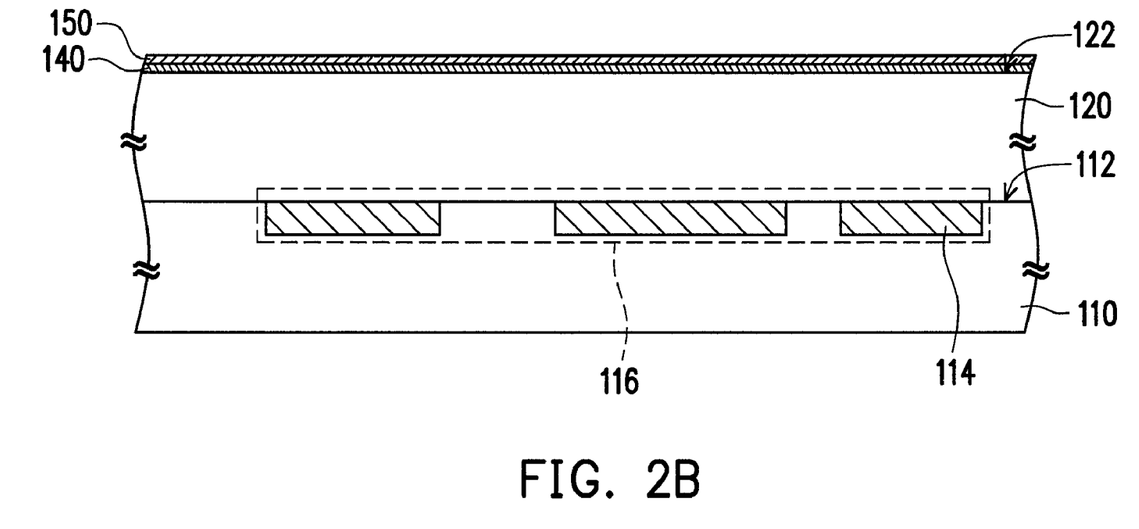

Next, referring to FIG. 2B, a dielectric layer 120 is formed on the circuit substrate 110. The dielectric layer 120 covers the first surface 112 and the first circuit 114. More specifically, the dielectric layer 120 has a second surface 122, and a metal layer 140 and a barrier layer 150 covering the metal layer 140 are formed on the second surface 122. In the present embodiment, the metal layer 140 is formed by an electroless plating process, and the metal layer 140 is, for example, an electroless copper layer. The barrier layer 150 is made of nickel, tin, chromium, zinc, or gold, for instance. Further, the dielectric layer 120 is made of a polymer compound, for example. The material of the dielectric layer 120 and the illustrations regarding the polymer compound can be referred to FIG. 1, and are thus not repeated hereinafter.

Figure 2C:
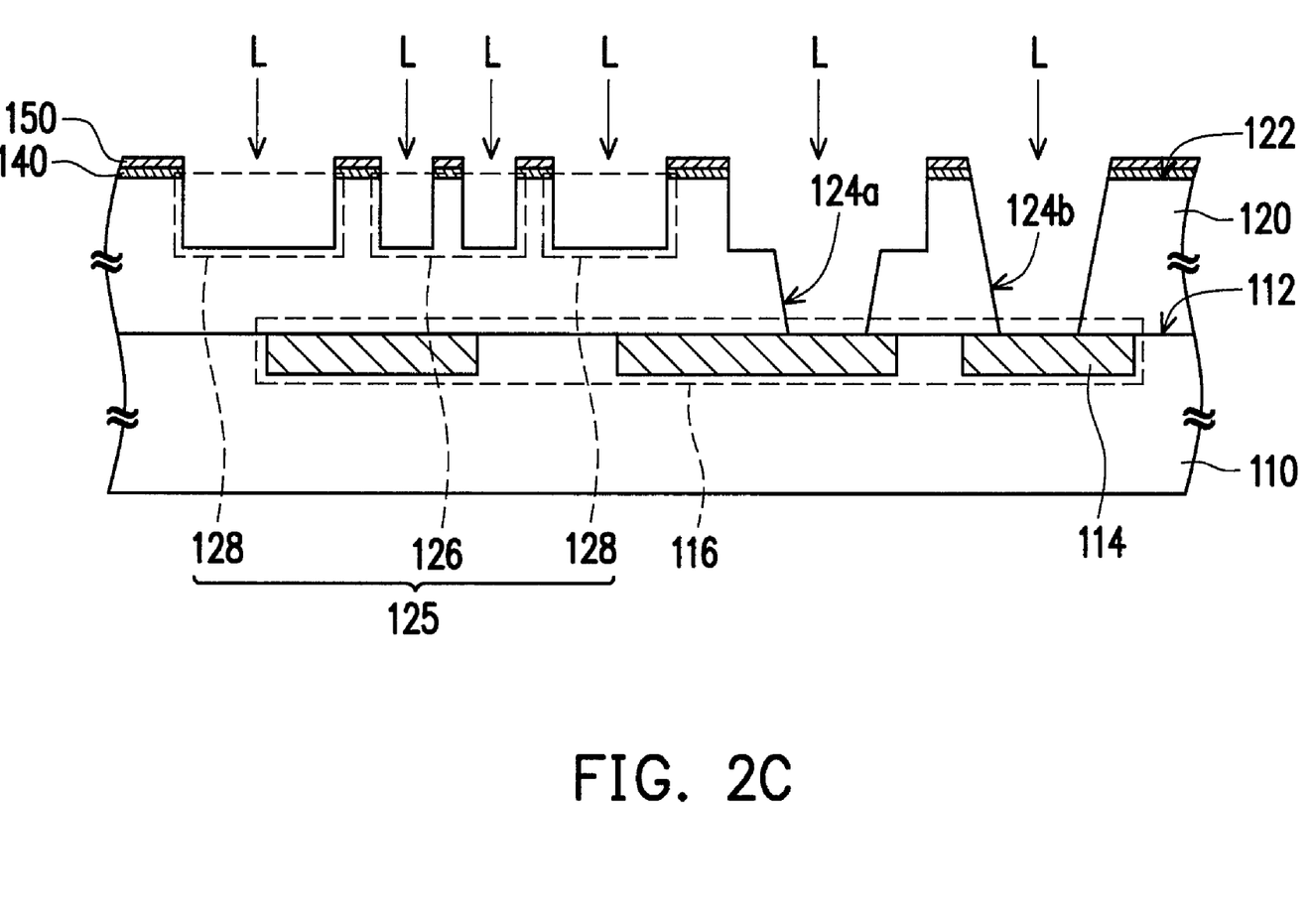

Referring to FIG. 2C, the barrier layer 150 is irradiated by a laser beam L to form an intaglio pattern 125 extending from the barrier layer 150 to the second surface 122 of the dielectric layer 120 and blind vias 124a, 124b extending to the first circuit 114 of the circuit substrate 110. Specifically, the intaglio pattern 125 includes a second intaglio pattern 126 and a third intaglio pattern 128. The third intaglio pattern 128 and the blind via 124a are connected to each other. The blind vias 124a, 124b expose a portion of the first circuit 114 disposed within the first intaglio pattern 116 of the circuit substrate 110. In the present embodiment, the laser beam L is a carbon dioxide laser beam.

Figure 2D:
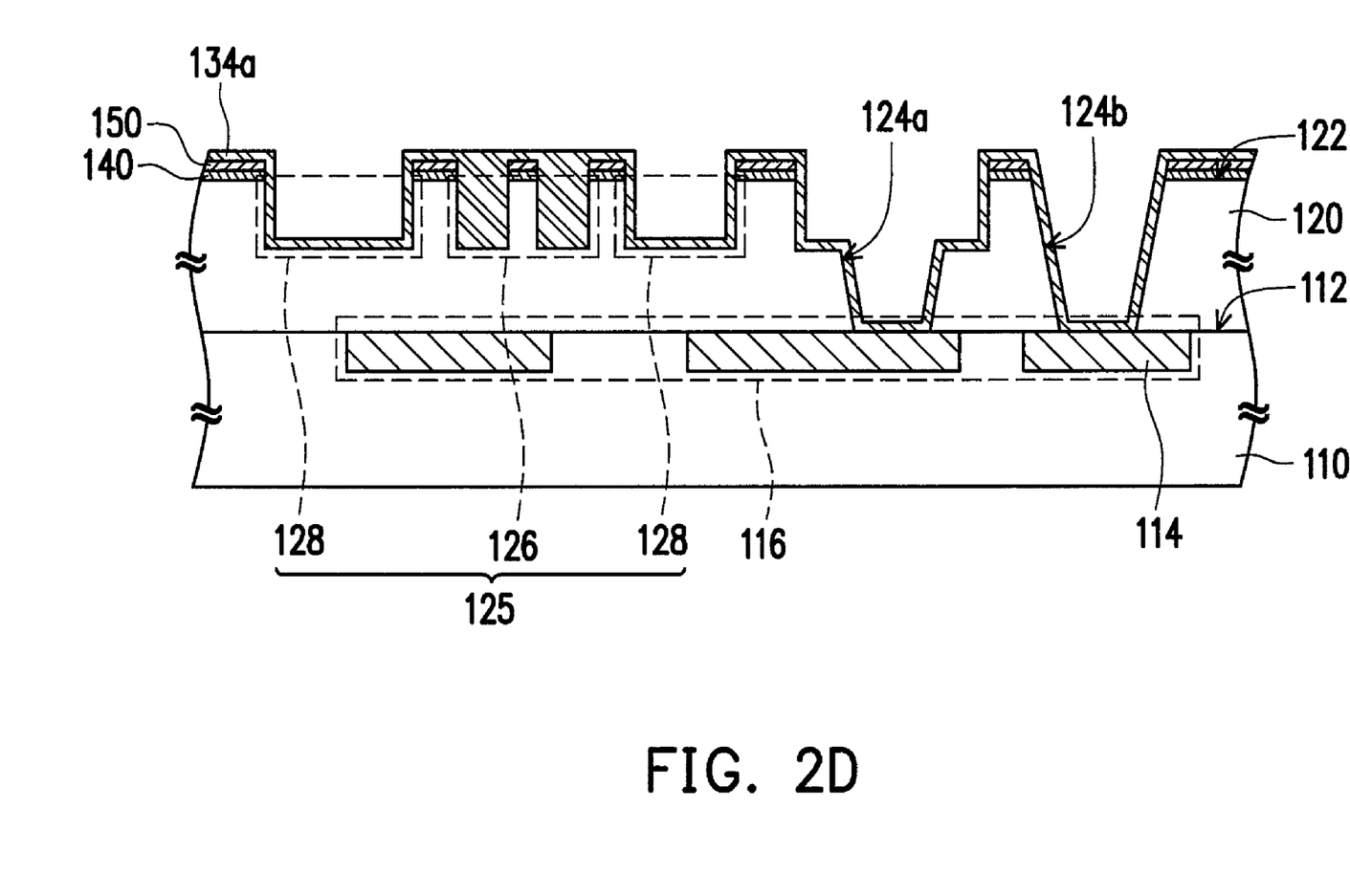

Referring to FIG. 2D, a first conductive layer 134a is formed within the intaglio pattern 125 and the blind vias 124a, 124b. In details, the first conductive layer 134a fills the second intaglio pattern 126 and is formed on inner walls of the third intaglio pattern 128 and the blind vias 124a, 124b. Furthermore, the first conductive layer 134a is formed by an electroless plating process, for example, and the first conductive layer 134a is an electroless copper layer or an electroless copper plating layer, for instance.

Figure 2E:
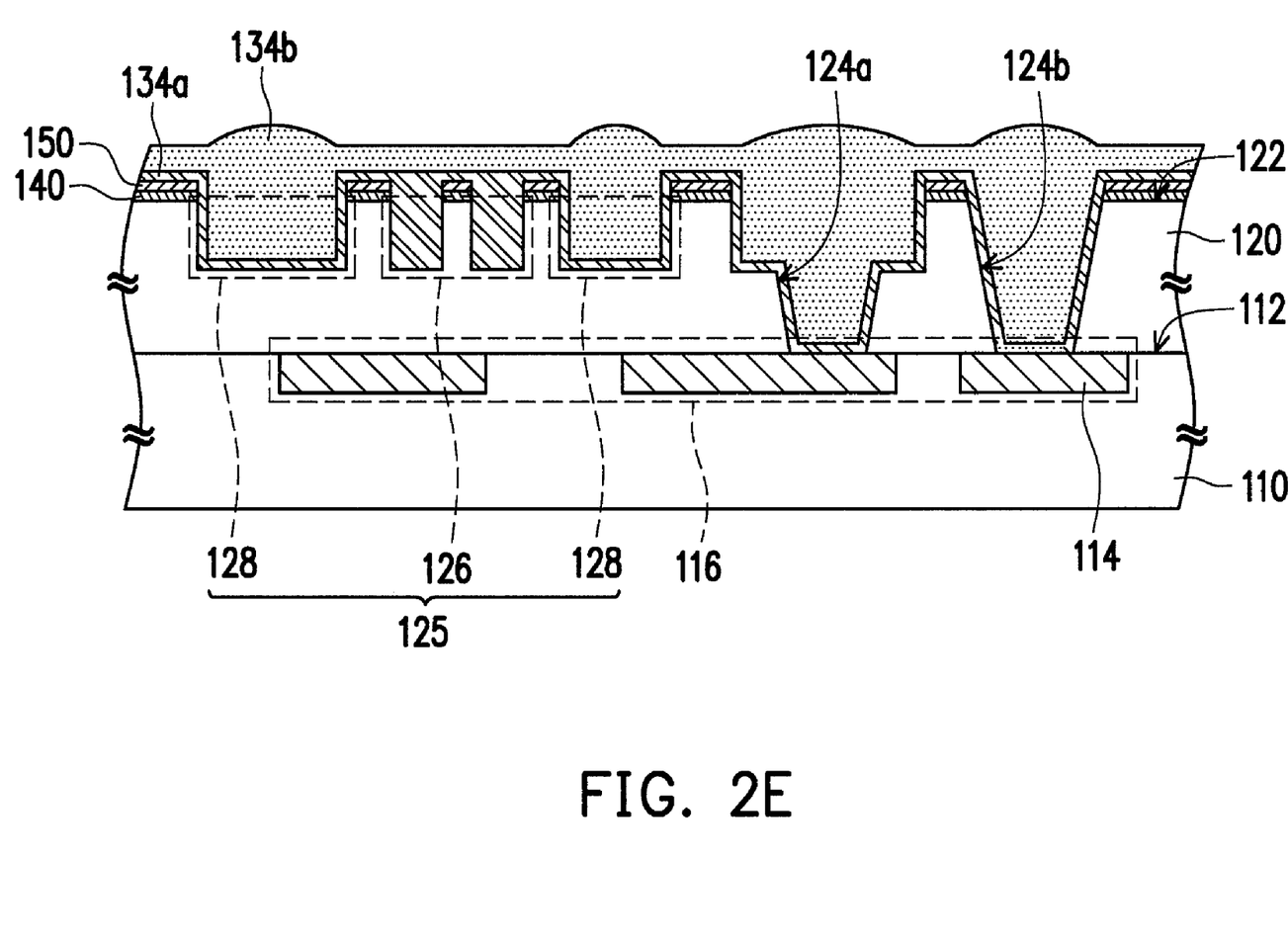
Figure 2F:
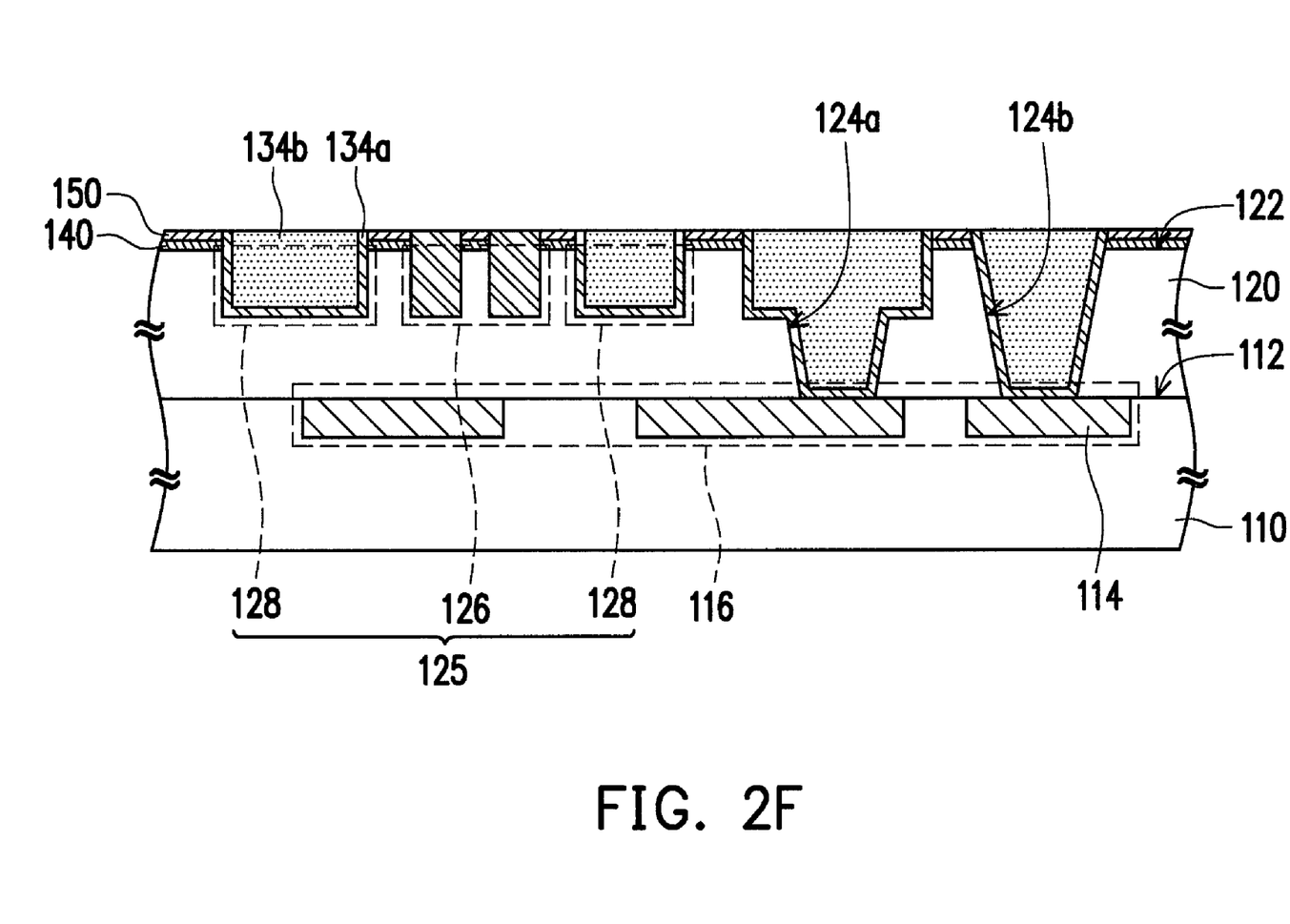

Referring to FIG. 2E, a second conductive layer 134b is formed on the first conductive layer 134a. In details, the second conductive layer 134b covers the first conductive layer 134a and fills the third intaglio pattern 128 and the blind vias 124a, 124b. Furthermore, the second conductive layer 134b is formed by an electroplating process, for example, and the second conductive layer 134b is an electroplated copper layer, for instance. In practice, an inhibitor is added to an electroplating tank, such that a deposition rate on the copper surface is smaller than a deposition rate in fill holes, and consequently the copper surface does not become too thick. Moreover, the local locations of larger pads, circuits, and holes are bulged on the surfaces thereof after electroplating due to the fill holes.

Thereafter, a portion of the second conductive layer 134b, the barrier layer 150, the metal layer 140, and a portion of the first conductive layer 134a are removed to form a patterned circuit structure 130a and expose the second surface 122 of the dielectric layer 120. In the present embodiment, the step of removing a portion of the second conductive layer 134b, the barrier layer 150, the metal layer 140, and a portion of the first conductive layer 134a is described below. Firstly, referring to FIG. 2F, a first etching process is performed to remove a portion of the second conductive layer 134b and a portion of the first conductive layer 134a until the barrier layer 150 is exposed. At this time, the barrier layer 150 is adopted as an etching stop layer for removing the first conductive layer 134a and the second conductive layer 134b outside of the second intaglio pattern 126, the third intaglio pattern 128, and the blind vias 124a, 124b. Consequently, the etching process can be controlled accurately to prevent over-etching or under-etching, so that the method of manufacturing the circuit board 100a of the present embodiment has superior manufacturing yield rate and reliability. Moreover, a polishing process can be performed to the barrier layer 150 after the first etching process, such that the surface of the barrier layer 150 is more flattened so as to facilitate the subsequent etching process.

Figure 2G:
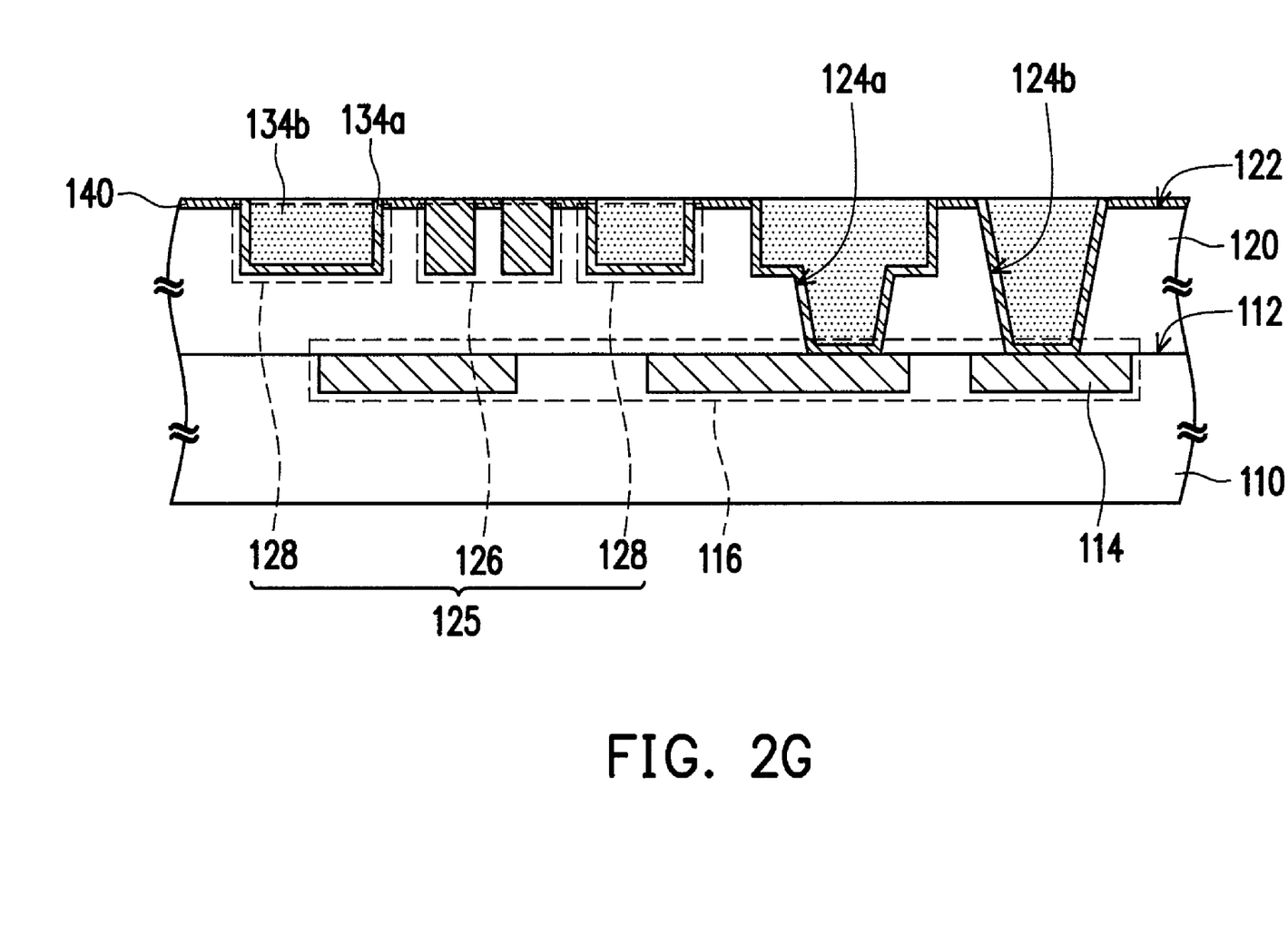

Referring to FIG. 2G, a second etching process is performed to remove the barrier layer 150 until the metal layer 140 is exposed. At this time, the metal layer 140 is adopted as the etching stop layer of the barrier layer 150 to prevent over-etching or under-etching, so that the etching process of the circuit board 100a is controlled more accurately. Finally, referring to FIG. 2H, a third etching process is performed to remove the metal layer 140 until the second surface 122 of the dielectric layer 120 is exposed, such that the patterned circuit structure 130a is formed.

Figure 2H:
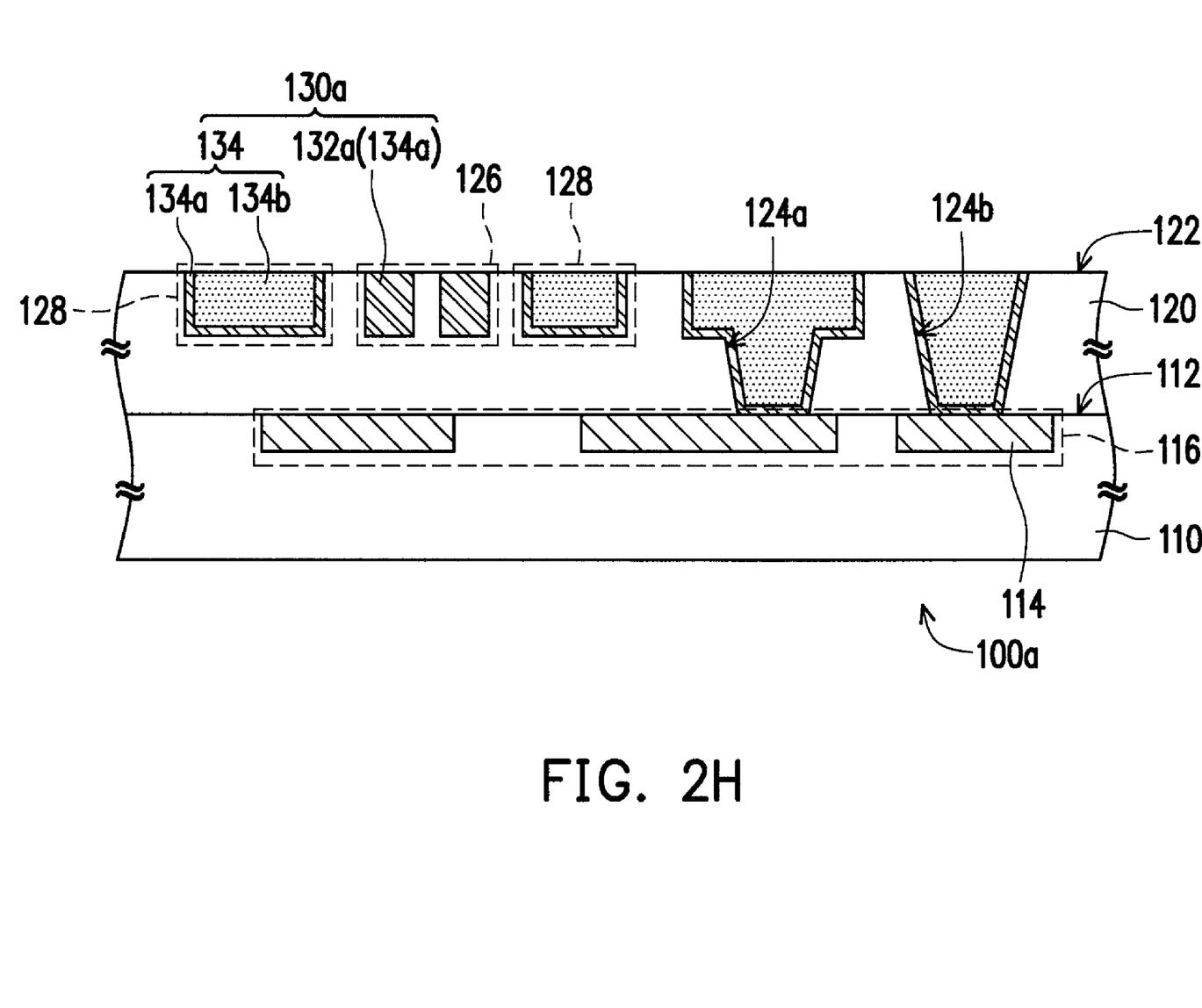

In details, the patterned circuit structure 130a is disposed within the second intaglio pattern 126, the third intaglio pattern 128, and the blind vias 124a, 124b. Moreover, the patterned circuit structure 130a is electrically connected to the first circuit 114 of the circuit substrate 110. The patterned circuit structure 130a includes at least one second circuit 132a (only two second circuits 132a are shown in FIG. 2H) and a plurality of third circuits 134 (only four third circuits 134 are shown in FIG. 2H). The second circuit 132a is disposed within the second intaglio pattern 126 and formed by filling the second intaglio pattern 126 with the first conductive layer 134a. The second circuit 132a substantially flats with the second surface 122 of the dielectric layer 120. In other words, the second circuit 132a is basically an embedded circuit. The third circuit 134 is disposed within the third intaglio pattern 128 and the blind vias 124a, 124b. The third circuit 134 is formed by the first conductive layer 134a and the second conductive layer 134b. The first conductive layer 134a is disposed between the second conductive layer 134b and the third intaglio pattern 128 and between the second conductive layer 134b and the blind vias 124a, 124b. In other words, the first conductive layer 134a of the third circuit 134 and the second circuit 132a are the same layer. The third circuit 134 substantially flats with the second surface 122 of the dielectric layer 120. In other words, the third circuit 134 is basically an embedded circuit. Moreover, the third circuits 134 disposed within the blind vias 124a, 124b are considered as a connected circuit. The third circuits 134 can be electrically connected to the first circuit 114 of the circuit substrate 110 through the third circuit 134 disposed within the blind via 124a.

Particularly, in the present embodiment, the line width of the second circuit 132a is thinner than the line width of each third circuit 134. In other words, relative to the second circuit 132a, the third circuits 134 are referred as the conventional circuits. Relative to the third circuits 134, the second circuit 132a is considered as the fine line. For example, in the present embodiment, the line width of the second circuit 132a, for example, is thinner than 15 μm, and the line width of each third circuit 134 is wider than the line width of the second circuit 132a. In other words, the line width of each third circuit 134 is wider than 15 μm. Up to this point, the manufacture of the circuit board 100a is substantially completed.

In short, the metal layer 140 and the barrier layer 150 are first formed on the dielectric layer 120 in the present embodiment. Then, the second intaglio pattern 126, the third intaglio pattern 128, and the blind vias 124a, 124b are formed on the dielectric layer 120 by using the laser beam L. Next, the first conductive layer 134a and the second conductive layer 134b are sequentially formed within the second intaglio pattern 126, the third intaglio pattern 128, and the blind vias 124a, 124b, so as to form the second circuit 132a having the single conductive layer and the third circuits 134 having the composite conductive layer within the same circuit layer. In addition, the barrier layer 150 is adopted as the etching stop layer for removing the first conductive layer 134a and the second conductive layer 134b outside of the second intaglio pattern 126, the third intaglio pattern 128, and the blind vias 124a, 124b in the etching process. The metal layer 140 is adopted as the etching stop layer of the barrier 150. As a result, the method of manufacturing the circuit board 100a of the present embodiment is capable of controlling the etching process effectively to prevent over-etching or under-etching. That is to say, the manufacture the circuit board 100a of the present embodiment has superior manufacturing yield rate and reliability. Moreover, the second surface 122 exposed after etching has superior flatness, which facilitates the subsequent build-up process of the circuit board 100a.

It should be noted that the invention does not limit the type of the second circuit 132a. Although the second circuit 132a mentioned herein is particularly a circuit structure having a single conductive layer. However, in other embodiments, the second circuit 132a of a circuit board 100b in FIG. 3E can also be the conventional circuit structure having two different conductive layers as the third circuits 134. In other words, the type of the second circuit 132a illustrated in FIG. 2H is merely an example, and the invention is not limited thereto.

It should be illustrated that the following embodiment adopts the reference numbers and partial content of the embodiments aforementioned. Here, the same reference numbers are used to denote the same parts, and the illustrations thereof are omitted. The illustrations of the omitted parts can refer to the embodiments aforementioned, and thus are not repeated hereinafter.

Figure 3A:
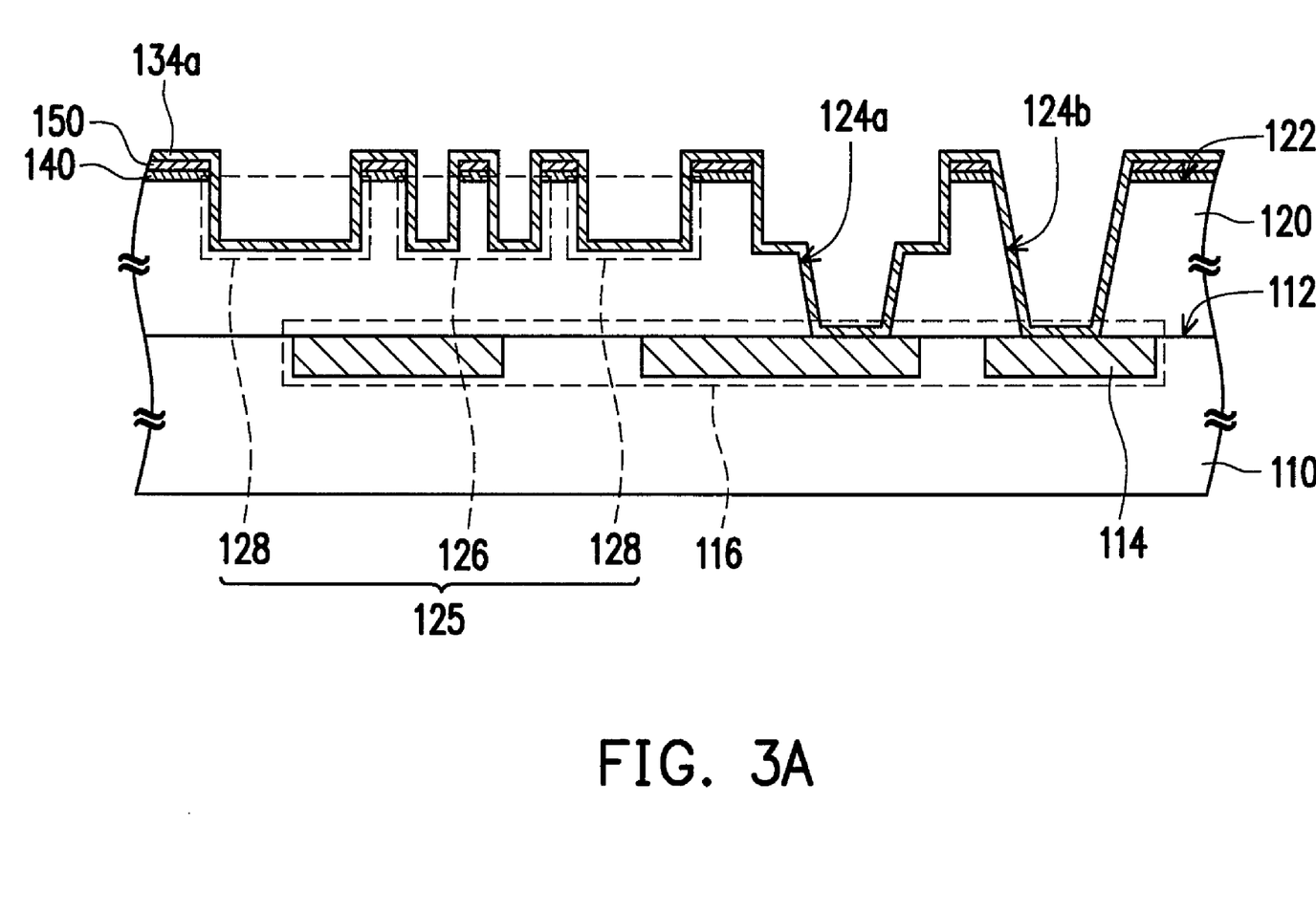
FIGS. 3A through 3E are schematic cross-sectional views illustrating a method of manufacturing a circuit board according to another embodiment of the invention.
Figure 3B:
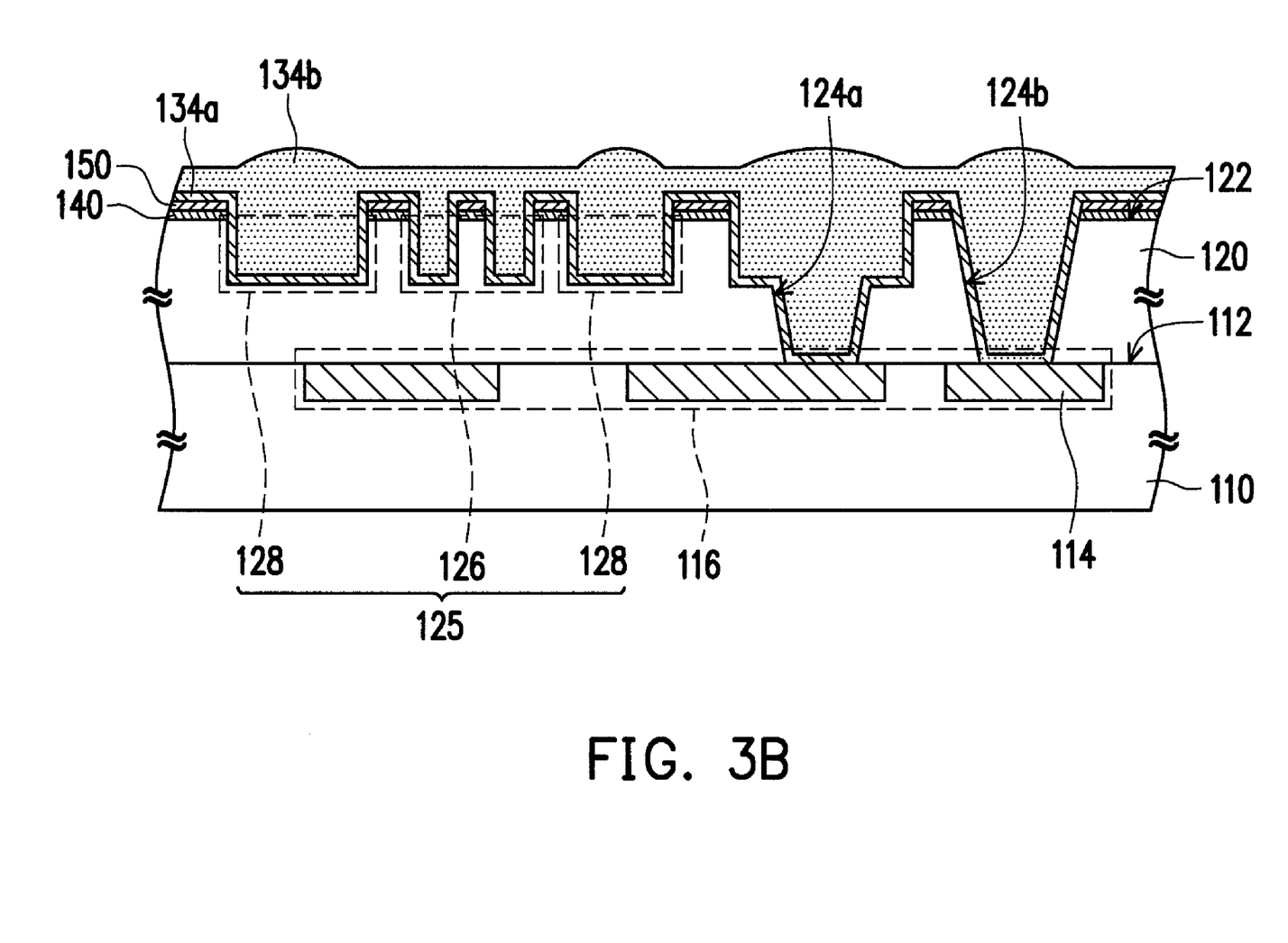
Figure 3C:
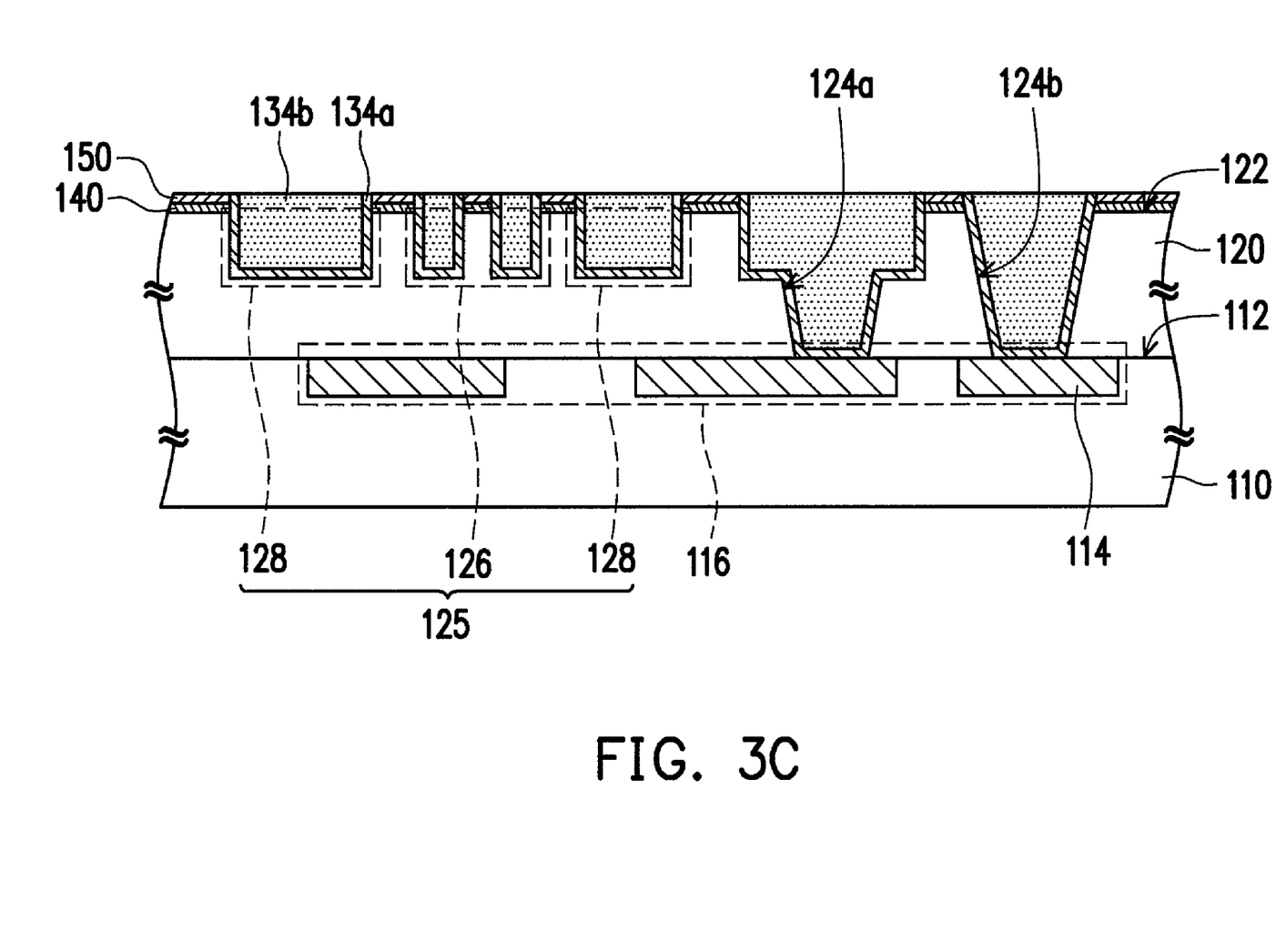
Figure 3D:
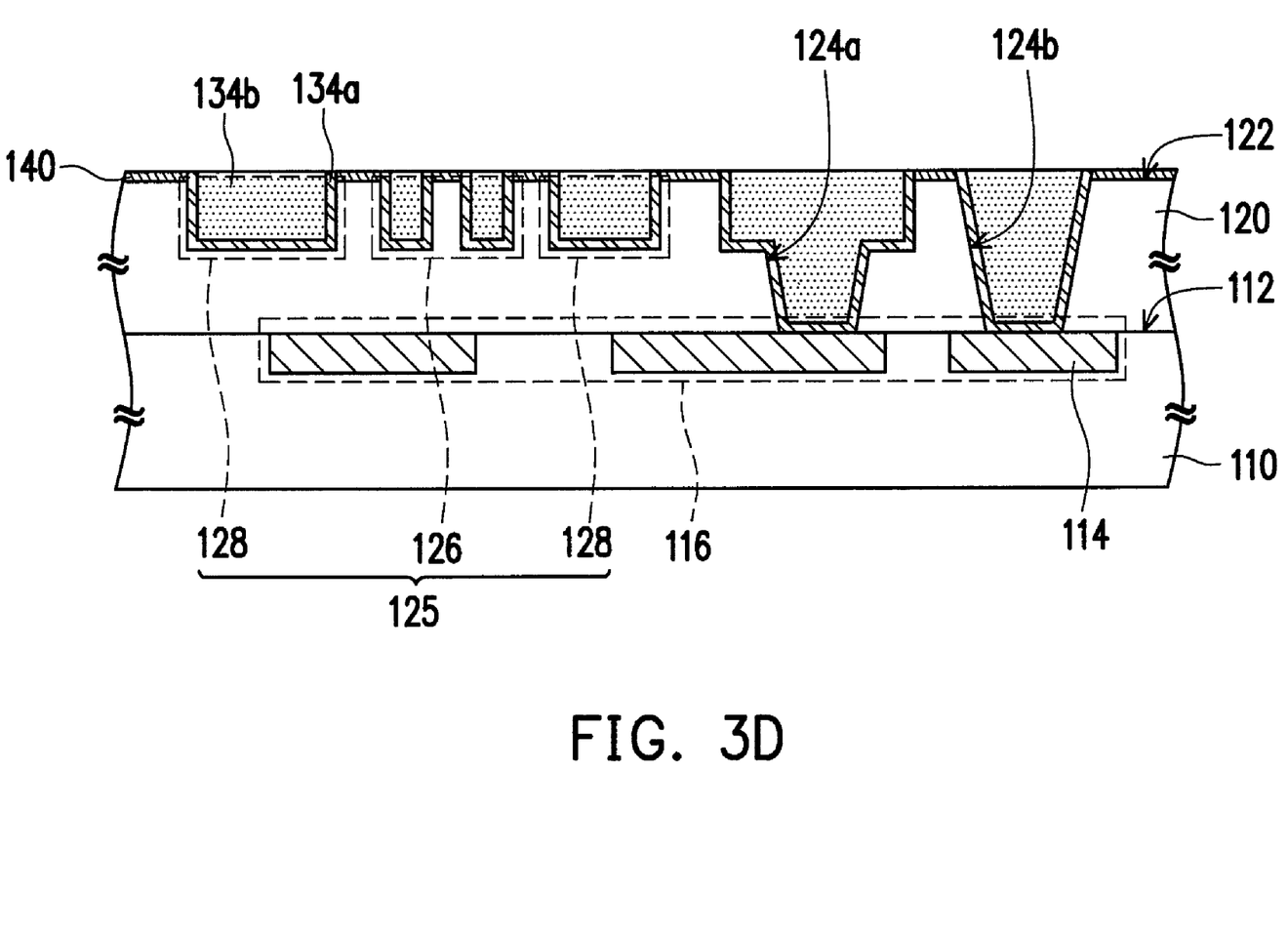
Figure 3E:
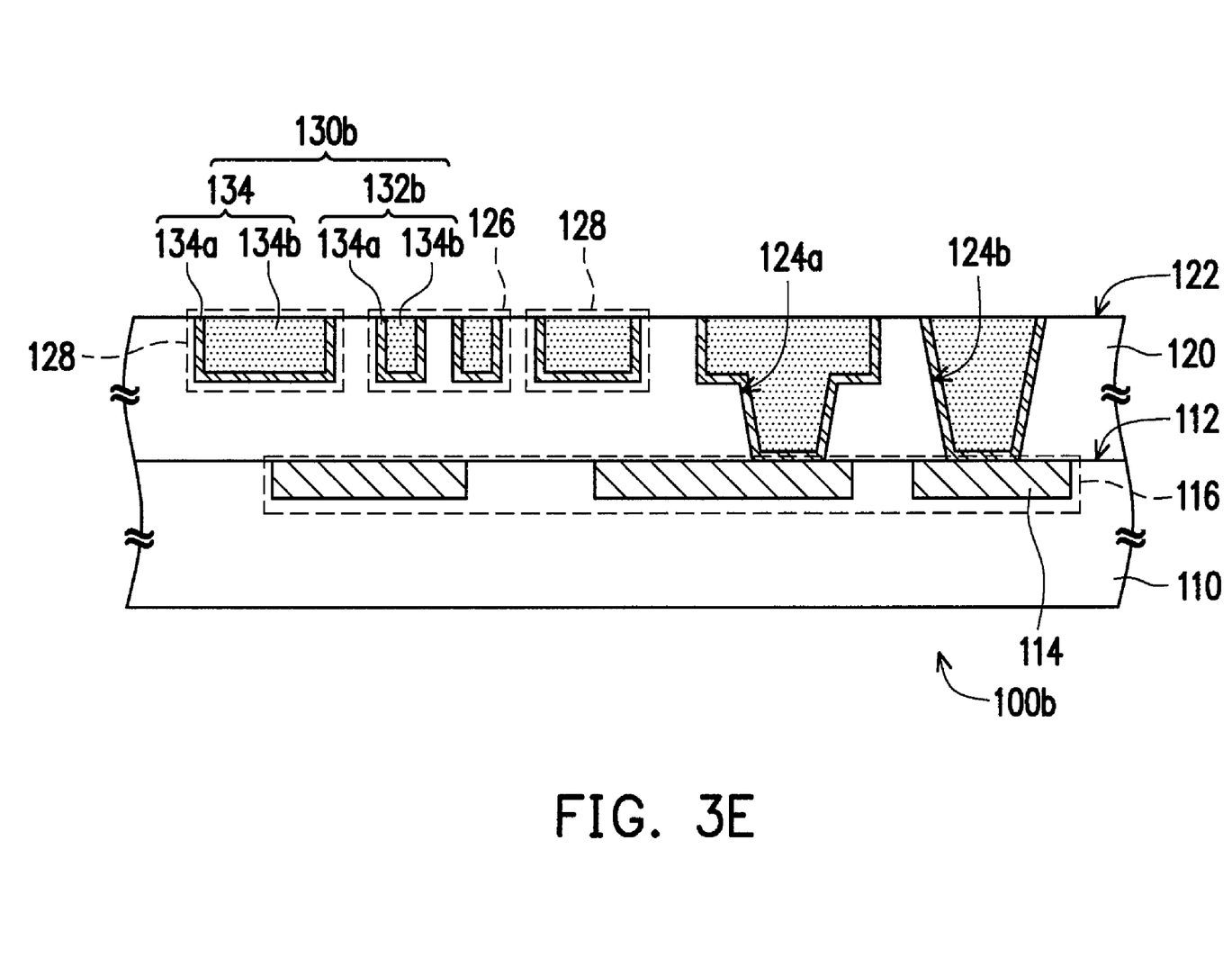

In details, in the manufacturing method, the circuit board 100b of FIG. 3E adopts a similar manufacturing method as the circuit board 100a of the embodiments aforementioned. In particular, after the barrier layer 150 is irradiated by a laser beam L to form the second intaglio pattern 126, the third intaglio pattern 128, and the blind vias 124a, 124b in FIG. 2C, referring to 3A, the first conductive layer 134a is formed on the inner walls of the second intaglio pattern 126, the third intaglio pattern 128, and the blind vias 124a, 124b. Referring to FIG. 3B, the second conductive layer 134b is formed on the first conductive layer 134a. Afterwards, referring to FIG. 3C, a first etching process is performed to remove a portion of the second conductive layer 134b and a portion of the first conductive layer 134a until the barrier layer 150 is exposed. Referring to FIG. 3D, a second etching process is then performed to remove the barrier layer 150 until the metal layer 140 is exposed. Finally, referring to FIG. 3E, a third etching process is performed to remove the metal layer 140 until the second surface 122 of the dielectric layer 120 is exposed, so that a patterned circuit structure 130a is formed. At this time, the second circuit 132b and the third circuits 134 of the patterned circuit structure 130b are the same, that is, they are all constituted by the first conductive layer 134a and the second conductive layer 134b. The line width of the second circuit 132b is liner than the line width of each third circuit 134. In other words, the circuit board 100b includes the second circuit 132b (that is, the fine line) and the third circuits 134 (that is, the conventional circuits) that are formed by two different conductive layers within the same circuit layer. Up to this point, the manufacture of the circuit board 100b is substantially completed.

In summary, the metal layer and the barrier layer are first formed on the dielectric layer in the invention. Then, the intaglio pattern and the blind vias are formed on the dielectric layer using the laser beam. Thereafter, the first conductive layer and the second conductive layer are sequentially formed within the intaglio pattern and the blind vias, so as to form the circuit having the composite conductive layer and the circuit having the single conductive layer and the composite conductive layer within the same circuit layer. In the etching process, the barrier layer is used as the etching stop layer for removing the conductive layer outside of the intaglio pattern and the blind vias. The metal layer is adopted as the etching stop layer of the barrier layer. Hence, the etching process can be controlled accurately, such that the manufacturing method of the circuit board of the invention has superior manufacturing yield rate and reliability. Also, the second surface exposed after etching has superior flatness, which facilitates the subsequent build-up process of the circuit board.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A method of manufacturing a circuit board, comprising:
   providing a circuit substrate having a first surface and at least one first circuit;
   forming a dielectric layer on the circuit substrate, and the dielectric layer covering the first surface and the at least one first circuit, wherein the dielectric layer has a second surface and a metal layer and a barrier layer covering the metal layer are formed on the second surface;
   irradiating the barrier layer with a laser beam to form an intaglio pattern extending from the barrier layer to the second surface of the dielectric layer and at least one blind via extending to the at least one first circuit of the circuit substrate;
   forming a first conductive layer within the intaglio pattern, the at least one blind via, and the barrier layer;
   forming a second conductive layer on the first conductive layer; and
   removing a portion of the second conductive layer, the barrier layer, the metal layer, and a portion of the first conductive layer to form a patterned circuit structure and expose the second surface of the dielectric layer, wherein the patterned circuit structure is disposed within the intaglio pattern and the blind via and electrically connected to the at least one first circuit of the circuit substrate.

2. The method of manufacturing the circuit board as claimed in claim 1, wherein the circuit substrate further comprises a first intaglio pattern disposed on the first surface and the first circuit is disposed within the first intaglio pattern.

3. The method of manufacturing the circuit board as claimed in claim 1, wherein a method of forming the metal layer comprises performing an electroless plating process.

4. The method of manufacturing the circuit board as claimed in claim 1, wherein a material of the barrier layer comprises nickel, tin, chromium, zinc, or gold.

5. The method of manufacturing the circuit board as claimed in claim 1, wherein the intaglio pattern comprises a second intaglio pattern and a third intaglio pattern, the third intaglio pattern is connected to the at least one blind via, the patterned circuit structure comprises at least one second circuit and a plurality of third circuits, the at least one second circuit is disposed within the second intaglio pattern, the plurality of third circuits is disposed within the third intaglio pattern and the at least one blind via, a line width of the at least one second circuit is thinner than a line width of each of the plurality of third circuits, and at least one of the plurality of third circuits is electrically connected to the at least one first circuit of the circuit substrate.

6. The method of manufacturing the circuit board as claimed in claim 5, wherein before the second conductive layer is formed on the first conductive layer, the first conductive layer fills the second intaglio pattern to form the second circuit of the patterned circuit structure.

7. The method of manufacturing the circuit board as claimed in claim 1, wherein a method of forming the first conductive layer comprises performing an electroless plating process.

8. The method of manufacturing the circuit board as claimed in claim 1, wherein a method of forming the second conductive layer comprises performing an electroplating process.

9. The method of manufacturing the circuit board as claimed in claim 1, wherein the step of removing a portion of the second conductive layer, the barrier layer, the metal layer, and a portion of the first conductive layer comprises:
   performing a first etching process to remove a portion of the second conductive layer and a portion of the first conductive layer until the barrier layer is exposed;
   performing a second etching process to remove the barrier layer until the metal layer is exposed; and
   performing a third etching process to remove the metal layer until the second surface of the dielectric layer is exposed.

10. The method of manufacturing the circuit board as claimed in claim 9, wherein before performing the second etching process, a polishing process is further performed to the barrier layer.

* * * * *